(12) United States Patent
Yasoda et al.

(10) Patent No.: US 6,722,245 B2
(45) Date of Patent: Apr. 20, 2004

(54) PUNCHING UNIT

(75) Inventors: Hisashi Yasoda, Ishikawa-ken (JP); Yoshikazu Muramatsu, Ishikawa-ken (JP)

(73) Assignee: UHT Corporation, Aichi (JP)

( * ) Notice: Subject to any disclaimer, the term of this patent is extended or adjusted under 35 U.S.C. 154(b) by 0 days.

(21) Appl. No.: 10/043,335

(22) Filed: Jan. 14, 2002

(65) Prior Publication Data

US 2002/0092392 A1 Jul. 18, 2002

(51) Int. Cl.⁷ ................................. B26D 7/28
(52) U.S. Cl. ................ 83/639.1; 83/699.61; 83/98
(58) Field of Search ............... 83/527, 698.91, 83/699.61, 140, 640, 99, 98, 639.1, 136

(56) References Cited

U.S. PATENT DOCUMENTS

| | | | | |
|---|---|---|---|---|
| 4,628,780 A | * | 12/1986 | Hicks | 83/99 |
| 4,662,256 A | * | 5/1987 | Hicks | 83/124 |
| 4,785,648 A | * | 11/1988 | Budrean et al. | 72/77 |
| 4,862,782 A | * | 9/1989 | Ernst | 83/552 |
| 5,090,282 A | * | 2/1992 | Ruesch | 83/13 |
| 5,331,836 A | * | 7/1994 | Cudzik | 72/346 |
| 5,450,756 A | * | 9/1995 | Kirii et al. | 73/825 |
| 6,220,138 B1 | * | 4/2001 | Sakamoto | 83/639.1 |
| 6,332,347 B1 | * | 12/2001 | Gomi | 72/355.6 |
| 6,463,831 B1 | * | 10/2002 | DiMaria | 76/107.1 |

* cited by examiner

Primary Examiner—Allan N. Shoap
Assistant Examiner—Ghassem Alie
(74) Attorney, Agent, or Firm—Greenblum & Bernstein, P.L.C.

(57) ABSTRACT

There will be provided a punching unit capable of reliably drawing a punch out of the workpiece, improving the productivity and without deteriorating the boring precision even for a workpiece which easily spreads, and preventing leavings rising. A stripper plates which has been positioned close to the workpiece in accordance with the thickness thereof does not press the workpiece, but draws the punch during rising out of the workpiece to transmit the striking driving force of the electric motor to the movable die holding the punch. In an air path portion arranged within the machine frame, there is provided means for opening or closing through an electric signal and the air path between the air ejecting unit and the means is made shorter, whereby the response to air ejection is improved, the pressure loss during air flow is reduced to a minimum, and jet air is accurately applied to punching chips (leavings) which adhere to the punch at the bottom dead center for peeling off the punch.

10 Claims, 2 Drawing Sheets

PUNCHING UNIT

BACKGROUND OF THE INVENTION

1. Field of the Invention

The present invention relates to a punching unit for boring a pattern, a reference hole or the like in a printed substrate, a flexibility film, a ceramic green sheet or the like, and more particularly to a punching unit suitable for boring a hole in a workpiece which easily spreads like the ceramic green sheet when a pressing force is applied.

2. Description of the Related Art

Heretofore, a punching unit of this type has been constructed such that there are, at the tip end-side upper part of the machine frame, provided a punch holding die together with a striking driving source, and at the tip end-side lower part, provided a die holding die corresponding to the punch holding die respectively and that a workpiece is carried in between the punch holding die and the die holding die to bore a hole into a required pattern, a reference hole or the like.

This punching unit is, on the machine base, provided in a necessary quantity close to one another side by side, and its punch holding die is equipped with a stripper mechanism which continuously presses (sandwiches) the workpiece between the die holding die and the punch holding die during a period of time from immediately before the punch comes into contact with the workpiece to a time at which the punch is drawn out.

For a striking driving source for the punch, an air cylinder, or an electric motor (for example, servo motor) is used.

In the air cylinder, pressure of air to be compressed is utilized as a driving force, and since air is a compression medium although low in cost, it is difficult to say that a movement of a piston for transmitting a striking force to a punch always coincides with the air pressure. As striking is continuously performed, there arises minute deviation in interlocking relation between supply and exhaust of air pressure for moving the piston up and down, thus making it impossible to expect punching at equal speed at all times. Actually, a problem for deteriorating the quality of the hole such as a punch bounding with minute amplitude at a punching bottom dead center is caused.

On the other hand, if an electric motor is used, the above described problem of air cylinder will be able to be solved.

In either case, however, since pressing (sandwiching) of the workpiece is continued during a period of time from immediately before punching to a time at which the punch is drawn out, a time for pressing by a stripper plate causes time loss which deteriorates the punching efficiency, deteriorating the productivity. In the case of, for example, ceramic green sheet which easily spreads, the pressing force spreads the workpiece, thus making it impossible to punch with high precision.

Also, an air passage which is connected to a punching hole of a die is connected to an air supply unit (for example, air compressor) provided in a factory where a machine base on which a punching unit is mounted is installed. An air path from the vicinity of the air supply unit to an air ejecting unit becomes long, and therefore, the response to air ejection is slow, and the pressure loss during air flow also becomes greater. For this reason, there has been also a problem that even if air is ejected toward the tip end of the punch at the bottom dead center at predetermined timing, air is not supplied at timing capable of peeling leavings and at predetermined air pressure and in a predetermined amount of air, but as a result, the punching operation is repeated while punching chips (shavings) adhere to the punch without being able to strip the leavings for reducing yields.

SUMMARY OF THE INVENTION

The present invention has been achieved in view of the above described conventional state of affairs, and is aimed to provide a punching unit capable of increasing productivity and yet not deteriorating the punching precision even for a workpiece which easily spreads.

Also, it is another object to provide a punching unit for preventing leavings rising.

Technical means instituted in order to achieve the above described object is characterized in that a punch ram is provided on the machine frame so as to be able to adjust the vertical moving height through the use of height adjusting means; the punch ram is provided with an electric motor which serves as a driving source; at the lower end of the punch ram, a stripper plate is mounted as a punch fixed die; a movable die holding a punch is disposed above the stripper plate so as to couple to the electric motor; and the electric motor is driven in a state in which the stripper plate is positioned close to the workpiece by the height adjusting means for boring a hole (First aspect).

In this case, the electric motor includes a servo motor, a linear motor, a stepping motor and the like.

According to the above described means, it becomes possible to cause the stripper plate at the lower end of the punch ram to approach in response to the workpiece to be punched by means of the height adjusting function of the punch ram using the height adjusting means. The stripper plate is caused to approach several $\mu$m spaced from the workpiece in such a manner that the workpiece is not pressed, but yet the punch can be drawn out of the workpiece when the punch is rising. Therefore, the stripper plate which has been positioned close to the workpiece in accordance with the thickness of the workpiece to be punched does not press the workpiece, but reliably draws the punch during rising out of the workpiece to increase the punching efficiency by eliminating time loss caused by continued pressing by the conventional stripper plate. Thus, the striking driving force of the electric motor is transmitted to the movable die holding the punch.

Also, within the machine frame, there is preferably introduced an air passage for supplying air into the air ejecting unit provided in the die and within the machine frame, there is provided means for opening or closing the air passage through an electric signal from the electric motor (Second aspect).

In this case, means for opening and closing through an electric signal, for example, an electric switching valve is preferably constructed such that the interior of the machine frame is formed hollow and that within the machine frame, the electric switching valve is provided at a position close to the die holding die.

With such structure, the air path between the air ejecting unit and the means for opening and closing the air passage becomes very short.

Accordingly, the pressure loss at the time of air ejection is reduced to a minimum at the same timing as punching bottom dead center, and jet air from the air ejecting unit is accurately applied to the tip end of the punch to peel the punching chips (leavings).

DETAILED DESCRIPTION OF THE PREFERRED EMBODIMENTS

Figure 1:
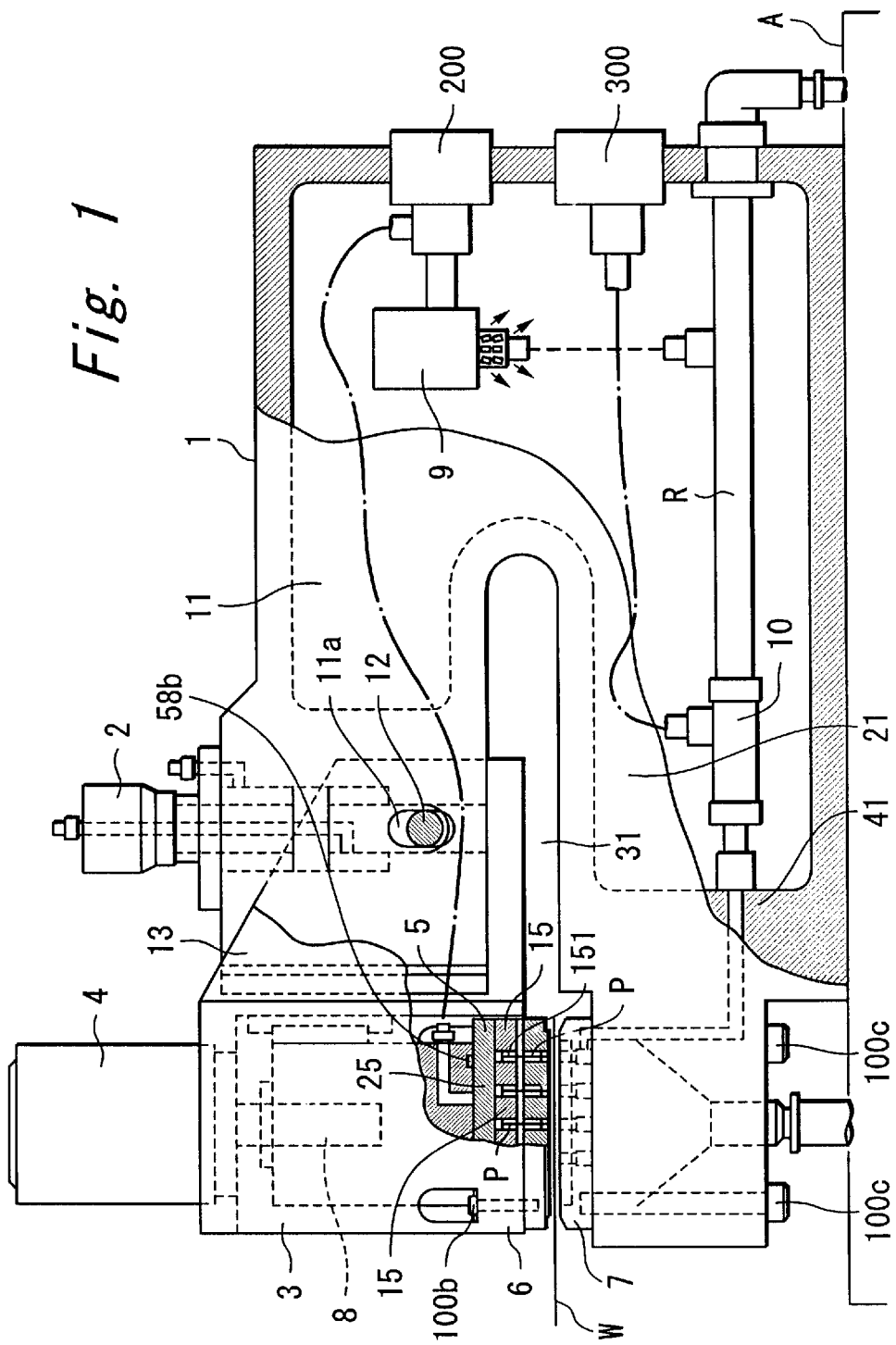
FIG. 1 is a partially exploded side view showing a punching unit according to the present embodiment.
Figure 2:
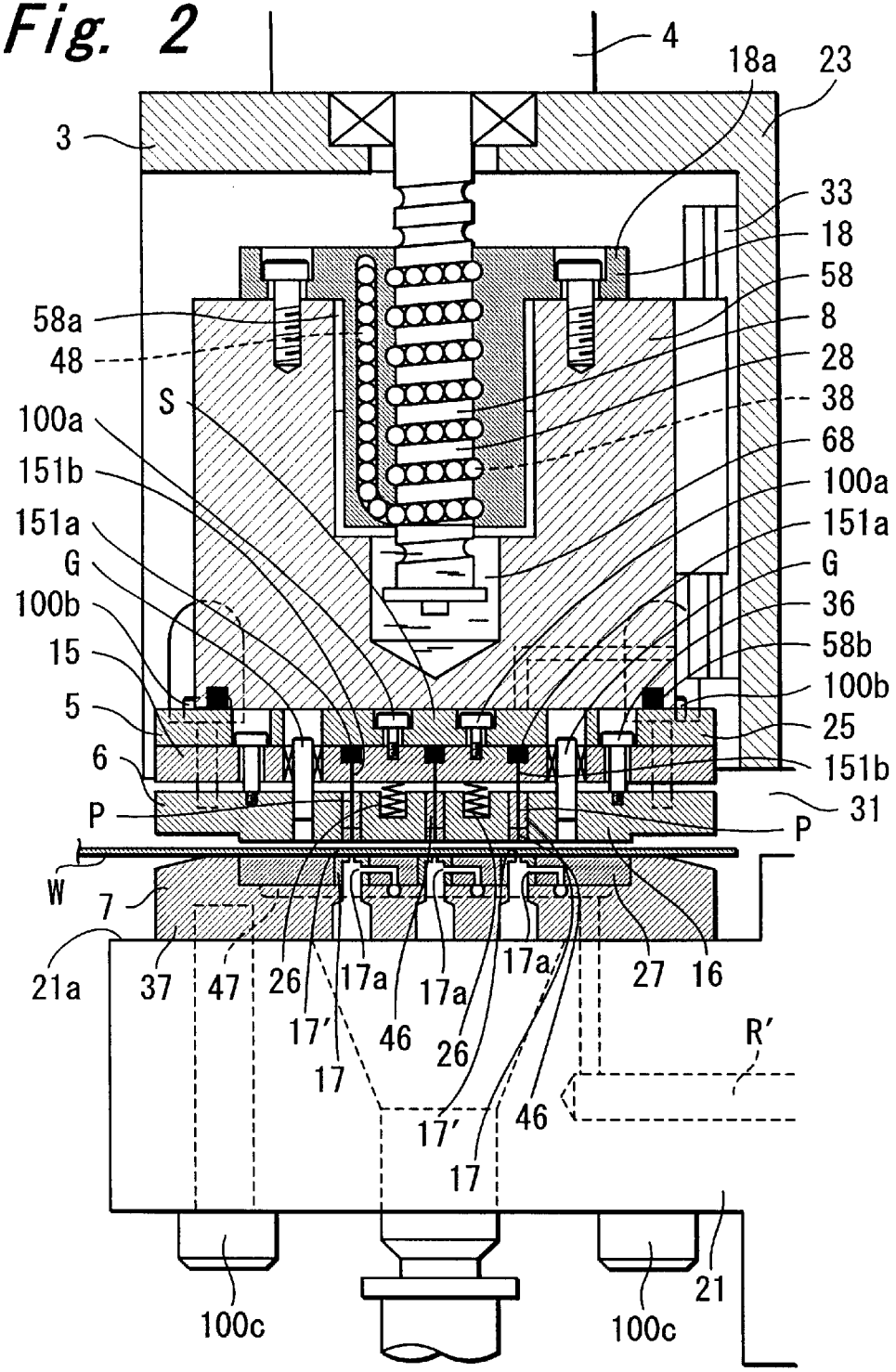
FIG. 2 is a partially exploded enlarged side sectional view showing an essential portion of FIG. 1.

Next, the description will be made of a punching unit according to an embodiment of the present invention. FIGS. 1 and 2 show a punching unit according to an embodiment of the present invention, more specifically, a punching unit equipped with a multi-spindle boring unit, and reference numeral 1 designates a machine frame thereof.

The machine frame 1 is a horizontally-oriented U-character-shaped hollow body whose central space is used as workpiece carrying-in space 31, and is detachably supported from a machine base A as in the case of the conventional example.

Also, this machine frame 1 supports an internally hollow-shaped punch ram 3 at the tip end edge of an upper half part 11 so as to be able to adjust the vertical moving height through the use of the air cylinder or manual height adjusting means 2 as conventionally well-known; the punch ram 3 is provided with an electric motor (for example, servo motor, which will be explained by attaching reference numeral 4 later) as a linear actuator or a striking driving source; a movable die 5 for holding the punch P by coupling to the servo motor 4 is disposed within the punch ram 3; a stripper plate (will be explained by attaching reference numeral 6 later) for sliding the punch P as a fixing die 6 is mounted to the lower end of the punch ram 3; and a die holding die 7 is, on the tip end side of the lower half part 21, disposed correspondingly to the movable die 5 and the stripper plate 6.

In FIG. 1, reference numeral 13 designates an arm plate extending along surfaces before and behind the tip end side of the upper half part 11 of the machine frame 1 from the punch ram 3, and this arm plate 13 is mounted to a locking pin 12 fixed to a rod which is vertically moved by the height adjusting means 2 to be adjusted in height. The vertical movement of the locking pin 12 is allowed by an amount corresponding to a slot 11a opened in the upper half part 11 so that the punch ram 3 is to be adjusted vertically in height along the tip end edge of the upper half part 11.

As shown in FIG. 2, the movable die 5 holding the punch is constituted such that the packing plate 25 is fixed with bolts 100a to the punch holder 15 having a required number of the punch engagement holes 151 punched in response to the number of punches P and formed by the engagement holes 151a at the head part of the punch P and by communicating the punch insertion holes 151b with the engagement holes 151a so as to cover the engagement holes 151a, wherein the head part of each of the punches P is held by the hole bottoms of the engagement holes 151a and the packing plate 25 to hold the required number of punches P.

A stripper plate 6 is, as shown in FIG. 2, constructed such that four corner portions of a plate body 16 in which a punch striking hole 161 has been opened correspondingly to the punch holding hole 151 are secured to the lower end of the punch ram 3 by means of a bolt 100b, a guide pin G, the lower end of which has been fixed, is inserted so as to be able to be guided by the guide bearing provided in the punch holder 15, and between the top surface and the punch holder 15, there is interposed a compression spring 26 to assist the movable die 5 to move up during rising of the punch P.

A reference numeral 36 designates a return regulating bolt for regulating an amount of return of the movable die, and 46 designates a guide sleeve of the punch P.

For means for transmitting a driving force from the servo motor 4 to the movable die 5, a ball screw 8 is used.

This ball screw 8 is of general structure, and as shown in FIG. 2, in each threaded groove 38 of a nut portion 18 and a screw portion 28, balls B . . . are placed in an adjacent state to each other and a return groove 48 is provided so as to be able to be circulated.

This ball screw 8 is inserted within a mounted recess 58a provided in the recess from the top surface of a block body 58 which engages a guide rail 33 in the inner surface of the punch ram 3 so as to be able to vertically move, a flange portion 18a of the nut portion 18 is fixed to the top surface of the block body 58, the lower end of the block body 58 is coupled to the packing plate 25 at the top end of the movable die 5, and when the servo motor 4 provided on the top plate 23 of the punch ram is driven, the screw portion 28 is driven for rotation, and the block body 58 does not rotate, but moves in a straight line, whereby the movable die 5 is adapted to move (downward) and return (upward) for boring a hole in the workpiece W to be bored.

In this respect, a reference numeral 68 designates an oil pan formed contiguously to the mounting recess 58a of the block body 58.

Coupling between the block body 58 and the movable die 5 has been performed by vacuum adsorption in the present embodiment.

This vacuum adsorption is performed by fitting an O-ring 58b for partitioning vacuum space S between the lower surface peripheral edge portion of the block body 58 and the top surface of the packing plate 25, and by sucking the vacuum space S through an ejector 9 within the machine frame 1.

This ejector 9 is connected to an air supplying unit (not shown) as shown in FIG. 1, and a compressed air conversion type for ejecting the air within the vacuum space S in a direction to suck the air in the vacuum space S (See FIG. 1), and air to be ejected is adapted to be released into the outside through the machine frame 1.

A die holding die 7 is, as shown in FIG. 2, composed of a die holder 27 holding a die 17 and a die pad 37, which are coupled together with a pin to be mutually positioned (not shown), and the die pad 37 is placed on an installation stepped portion 21a provided in the recess on the top surface of the lower half part 21 of the machine frame 1 and is secured to the lower half part 21 from the underside by a bolt 100c.

Also, in each of these dies 17 . . . , air ejecting units (holes) 17a . . . which communicate to a connecting path 47 which has been arranged in the die holder 27 and the die pad 37 as shown in FIG. 2, are opened facing directly below the punching hole 17', and a starting end of the connecting path 47 extends to a partition wall 41 portion with a hollow unit in the lower half part 21 of the machine frame 1, and to the starting end which is this opening end, the air passage R which communicates to the air supplying unit (not shown) is introduced within the machine frame 1 and is connected.

Thus, in the air passage R within this machine frame 1, at a position close to the die holding die 7, more specifically, in the vicinity of the partition wall 41 approaching to the die holding die 7, there is provided means (for example, electric switching valve) 10 for opening or closing through an electric signal; on receipt of an output signal at the punch bottom dead center by the servo motor 4, the means 10 which operates through the control unit (not shown) opens the air passage R to send air under pressure to the air path (including the connecting path) R' downstream of the means 10, whereby a predetermined amount of air at predetermined pressure is to be ejected toward the punch tip end P from the air ejecting unit (hole) 17a at the same timing as when the punch P arrives at the bottom dead center for peeling punching chips (leavings) which adhere to the punch P tip end.

In this respect, a reference numeral 200 designates a vacuum pressure gage for indicating coupled pressure between the movable die and the block body, that is, adsorption pressure, and 300, a pressure gage for indicating air supply pressure to be ejected from the air ejecting unit (hole) 17a, and both are attached onto the back surface of the machine frame 1.

A punching unit according to the present embodiment constructed as described above lowers the punch ram 3 by means of the height adjusting means 2 to a position (position approaching several $\mu$m) where the stripper plate 6 at the lower end of the punch ram 3 approaches to the workpiece W in accordance with the thickness of the workpiece W to be bored.

Thus, the ascending and descending speeds of the movable die 5 by the servo motor 4 are set in accordance with the hardness of the workpiece W, and control action is performed in the X axial direction and Y axial direction while the workpiece W is being carried in the carrying-in space 31, for boring with a predetermined boring pattern in a boring area partitioned and formed on the workpiece W.

Although not shown in the drawing, when the workpiece W is, for example, a punched item such as a ceramic green sheet, a flexible film and the like which can not keep its flat shape without any support, the workpiece is removably attached to the workpiece holder to perform the punching process. Further, when the workpiece holder passes, the punch ram 3 is ascended to prevent a hindrance of motion of the stripper plate 6 at its lower end with the workpiece holder.

During the punching process (the air supplying unit is being operated), means 10 to be opened or closed with an electrical signal through a control unit (not shown) opens the air passage R in concurrent with the time in which the punch P reaches the bottom dead center, ejects air from the air ejecting unit (hole) 17a toward the extremity end of the punch P to peel off the punching chips adhered to it.

As described above, the present invention is operated such that the stripper plate positioned while being approached in compliance with a thickness of the workpiece to be punched pulls out the punch being ascended from the workpiece without pressing the workpiece, so that the present invention does not decrease a punching efficiency due to a time loss of the pressing time of a stripper mechanism such as the prior art punching unit for keeping the pressed state until a workpiece is pressed by a stripper mechanism, punched with it and the punch is pulled out of the workpiece, resulting in that its productivity can be substantially improved.

In addition, since the present invention does not employ any structure for pressing a workpiece when a punching operation is performed, it is possible to provide a punching unit suitable for improving a productivity and punching work for a workpiece material such as a ceramics green sheet or the like which may easily be elongated.

Additionally, since an electric motor (such as a servo motor, a linear motor and a stepping motor or the like) is applied as a striking driving source, an isokinetic punching always kept constant as well as the most-suitable punching process coinciding with a desired punching speed corresponding to a hardness of the workpiece, e.g. various kinds of conditions such as a hardness and a thickness of a workpiece or the like.

Further, means for opening or closing an air passage portion with an electrical signal from the electric motor is arranged within the machine frame, preferably at the air passage near the die holding die within the machine frame, so that it does not become a hindrance against a side-by-side arrangement near the machine frame or a loading-in of the workpiece to be punched into the punching unit as found in the case that, for example, means for opening or closing the air passage portion either at the outer position or the inner position of the die holding die in the machine frame, further narrows an air passage between the means and the air ejection unit, improves its responding characteristic and restricts its pressure loss to a minimum value.

Accordingly, it is possible to eject air from the air ejecting part toward the extremity end of the punch with a predetermined air pressure and a predetermined air volume in a concurrent timing with the punch bottom dead center, apply an air jet to punching chips (leavings), peel them from the punch, and improve a yield of the product without hindering a specification where the desired number of punching units are approached and arranged in a side-by-side relation.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope

What is claimed is:

1. A punching unit for forming holes in a workpiece, said punching unit comprising:
    a punch ram adjustably mounted on a machine frame of said punching unit, wherein a vertical position of said punch ram is adjusted depending on a thickness of the workpiece;
    a lower stationary die mounted on the machine frame below the punch ram for supporting the workpiece thereon;
    an upper movable die movably mounted to said punch ram, wherein said upper movable die is configured to vertically reciprocate relative to said punch ram;
    a motor for reciprocating said upper movable die relative to said punch ram;
    at least one punch mounted to said upper movable die for reciprocation toward and away from said lower stationary die; and
    a stripper plate directly mounted to said punch ram below said upper movable die, said stripper plate including at least one opening therethrough, wherein said at least one punch is aligned with and passes through the at least one opening of said stripper plate;
    wherein said punch ram is positioned such that said stripper plate is located adjacent to the workpiece on said lower stationary die, without contacting the workpiece or said lower stationary die, prior to said motor moving said upper movable die and said at least one punch toward the workpiece and said lower stationary die, said at least one punch being movable while said stripper plate remains spaced from the workpiece during punching operations, wherein the workpiece is not pressed between said stripper plate and said lower stationary die during punching operations, so that the workpiece is only contacted from above by said at least one punch during punching operations.

2. The punching unit according to claim 1, wherein the workpiece is a ceramic green sheet.

3. The punching unit according to claim 1, wherein the workpiece is not pressed between said stripper plate and said lower stationary die during punching operations.

4. The punching unit according to claim 1, further comprising an air supply provided within the machine frame and configured to provide ejecting air to at least one of said lower stationary die and said upper movable die.

5. The punching unit according to claim 4, wherein provision of ejecting air by said air supply to the at least one of said lower stationary die and said upper movable die is controlled by a signal from said motor.

6. The punching unit according to claim 4, wherein said air supply includes an electric switching valve positioned adjacent to the at least one of said lower stationary die and said upper movable die.

7. The punching unit according to claim 1, wherein said at least one punch includes a plurality of punches, said at least one opening includes a plurality of openings, and each of the plurality of punches is aligned with and passes through a corresponding one of the plurality of openings.

8. The punching unit according to claim 7, wherein said lower stationary die includes a plurality of die openings aligned with the plurality of punches and the plurality of openings.

9. The punching unit according to claim 1, further comprising at least one guide pin that maintains alignment of said stripper plate and said upper movable die.

10. The punching unit according to claim 1, further comprising at least one spring positioned between said stripper plate and said upper movable die.

* * * * *

UNITED STATES PATENT AND TRADEMARK OFFICE
CERTIFICATE OF CORRECTION

PATENT NO. : 6,722,245 B2
DATED : April 20, 2004
INVENTOR(S) : H. Yasoda et al.

It is certified that error appears in the above-identified patent and that said Letters Patent is hereby corrected as shown below:

<u>Title page,</u>
Insert Item:
-- [30]  Foreign Application Priroity Data
   Japanese Application No. 2001-7869, filed January 16, 2001 --.

Signed and Sealed this

Eighth Day of March, 2005

JON W. DUDAS
*Director of the United States Patent and Trademark Office*